(12) United States Patent
Yachi

(10) Patent No.: US 9,548,229 B2
(45) Date of Patent: Jan. 17, 2017

(54) SUBSTRATE PROCESSING APPARATUS, METHOD OF PROCESSING SUBSTRATE, AND METHOD OF MANUFACTURING SEMICONDUCTOR DEVICE

(71) Applicant: HITACHI KOKUSAI ELECTRIC INC., Tokyo (JP)

(72) Inventor: Masamichi Yachi, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 14/431,678

(22) PCT Filed: Sep. 4, 2013

(86) PCT No.: PCT/JP2013/073742
§ 371 (c)(1),
(2) Date: Mar. 26, 2015

(87) PCT Pub. No.: WO2014/050464
PCT Pub. Date: Apr. 3, 2014

(65) Prior Publication Data
US 2015/0279712 A1    Oct. 1, 2015

(30) Foreign Application Priority Data
Sep. 27, 2012 (JP) .................. 2012-214231

(51) Int. Cl.
*H01L 21/673* (2006.01)
*H01L 21/67* (2006.01)
(Continued)

(52) U.S. Cl.
CPC ......... *H01L 21/67389* (2013.01); *C23C 16/54* (2013.01); *H01L 21/324* (2013.01);
(Continued)

(58) Field of Classification Search
CPC ................. H01L 21/67389; H01L 21/67196; H01L 21/67757; H01L 21/67376
See application file for complete search history.

(56) References Cited

U.S. PATENT DOCUMENTS 3,042,158 A * 7/1962 Michaels ................ F16B 12/50
403/288
4,696,568 A * 9/1987 Weistra ................... G01S 17/58
342/104
(Continued)

FOREIGN PATENT DOCUMENTS

JP      11-121602 A     4/1999
JP      2004-273603 A   9/2004
(Continued)

*Primary Examiner* — Kaitlin Joerger
(74) *Attorney, Agent, or Firm* — Volpe and Koenig, P.C.

(57) ABSTRACT

The present invention shortens the time needed to decrease the oxygen concentration in a chamber to be filled with an inert gas to a desired concentration. A substrate processing apparatus includes: a processing chamber configured to process a substrate; and a carrying chamber configured to carry the substrate to the processing chamber. The carrying chamber includes: a plurality of wall bodies configured to form a housing of the carrying chamber; a joint at which the plurality of wall bodies are joined; an isolated space creating member configured to cover the joint and thereby create an isolated space separated from the carrying chamber; and an exhaust section configured to purge gas in the isolated space.

10 Claims, 8 Drawing Sheets

(51) Int. Cl.
*H01L 21/677* (2006.01)
*C23C 16/54* (2006.01)
*H01L 21/324* (2006.01)

(52) U.S. Cl.
CPC .. *H01L 21/67196* (2013.01); *H01L 21/67376* (2013.01); *H01L 21/67757* (2013.01)

(56) References Cited

U.S. PATENT DOCUMENTS

| | | | | |
|---|---|---|---|---|
| 5,853,176 | A * | 12/1998 | Kiriyama | B01J 3/006 220/681 |
| 6,199,604 | B1 | 3/2001 | Miyajima | |
| 7,559,180 | B2 * | 7/2009 | Ajiki | F16B 7/0473 403/172 |
| 8,590,902 | B2 * | 11/2013 | Yamada | H01L 21/67196 220/4.33 |
| 2002/0021936 | A1 * | 2/2002 | Rae-Smith | E04G 17/001 403/403 |
| 2002/0037195 | A1 * | 3/2002 | Ajiki | F16B 7/187 403/403 |
| 2007/0110548 | A1 | 5/2007 | Oyama et al. | |
| 2007/0209593 | A1 * | 9/2007 | Aggarwal | C23C 16/54 118/724 |

FOREIGN PATENT DOCUMENTS

| | | | |
|---|---|---|---|
| JP | 2005-026513 | A | 1/2005 |
| JP | 2008-294248 | A | 12/2008 |
| JP | 2009-065113 | A | 3/2009 |
| JP | 2011-044633 | A | 3/2011 |
| JP | 2012-028413 | A | 2/2012 |

\* cited by examiner

SUBSTRATE PROCESSING APPARATUS, METHOD OF PROCESSING SUBSTRATE, AND METHOD OF MANUFACTURING SEMICONDUCTOR DEVICE

TECHNICAL FIELD

The present invention relates to a technique for subjecting a substrate such as a semiconductor wafer (referred to below as a wafer) to, for example, a heat treatment. More specifically, the present invention relates to a substrate processing apparatus, a method of processing a substrate, and a method of manufacturing a semiconductor device that is capable of suppressing a native oxide film from being generated on a surface of a substrate.

RELATED ART

When heat treatments are performed during an IC manufacturing process, for example, in order to form insulating, metal and semiconductor films on wafers and/or diffuse impurities, vertical thermal treatment apparatuses are used. In an exemplary vertical thermal treatment apparatus, a plurality of wafers are mounted on a boat and then subjected to batch processes simultaneously. Such a vertical heat treatment apparatus includes a processing chamber and a transfer chamber. In the processing chamber, a plurality of wafers arranged on a boat are subjected to processes; in the transfer chamber, the wafers are placed on the boat before the processes. Some of these transfer chambers are designed to suppress native oxide films from being formed on wafers. More specifically, an inert gas, such as nitrogen gas, is filled in a transfer chamber in order to decrease its oxygen concentration whereby the wafers are isolated from oxygen (refer to Patent Literature 1). In conventional vertical thermal treatment apparatuses, unfortunately, considerable time is required to decrease an oxygen concentration in the transfer chamber to a desired concentration, which is a problem for improving the throughput.

CITATION LIST

Patent Literature

Patent Literature 1: JP 2009-65113 A

SUMMARY OF INVENTION

Technical Problem

An object of the present invention is to provide a substrate processing apparatus, a method of processing a substrate, and a method of manufacturing a semiconductor device that is capable of shortening the time needed to decrease an oxygen concentration in a housing to a desired concentration.

Solution to Problem

An aspect of the present invention provides a substrate processing apparatus that includes: a processing chamber configured to process a substrate; and a carrying chamber configured to carry the substrate to the processing chamber. The carrying chamber includes: a plurality of wall bodies configured to form a housing of the carrying chamber; a joint at which the plurality of wall bodies are joined; and an isolated space creating member configured to cover the joint and thereby provide an isolated space separated from the carrying chamber. The substrate processing apparatus includes an exhaust section configured to purge gas in the isolated space.

Another aspect of the present invention provides a method of processing a substrate which uses a substrate processing apparatus. The substrate processing apparatus includes: a processing chamber configured to process a substrate; and a carrying chamber configured to carry the substrate to the processing chamber. The carrying chamber includes: a plurality of wall bodies configured to form a housing of the carrying chamber; a joint at which the plurality of wall bodies are joined; and an isolated space creating member configured to cover the joint and thereby provide an isolated space separated from the carrying chamber. The method of processing a substrate includes: carrying a substrate from the carrying chamber into the processing chamber; purging gas in the isolated space; and processing the substrate that has been carried into the processing chamber.

Another aspect of the present invention provides a method of manufacturing a semiconductor device which uses a substrate processing apparatus. The substrate processing apparatus includes: a processing chamber configured to process a substrate; and a carrying chamber configured to carry the substrate to the processing chamber. The carrying chamber includes: a plurality of wall bodies configured to form a housing of the carrying chamber; a joint at which the plurality of wall bodies are joined; and an isolated space creating member configured to cover the joint and thereby provide an isolated space separated from the carrying chamber. A method of manufacturing a semiconductor device includes: carrying a substrate from the carrying chamber into the processing chamber; purging gas in the isolated space; and processing the substrate that has been carried into the processing chamber.

Advantageous Effects of Invention

The present invention provides a substrate processing apparatus, a method of processing a substrate, and a method of manufacturing a semiconductor device that is capable of shortening the time needed to decrease an oxygen concentration in a housing to a desired concentration.

DESCRIPTION OF EMBODIMENTS

Figure 1:
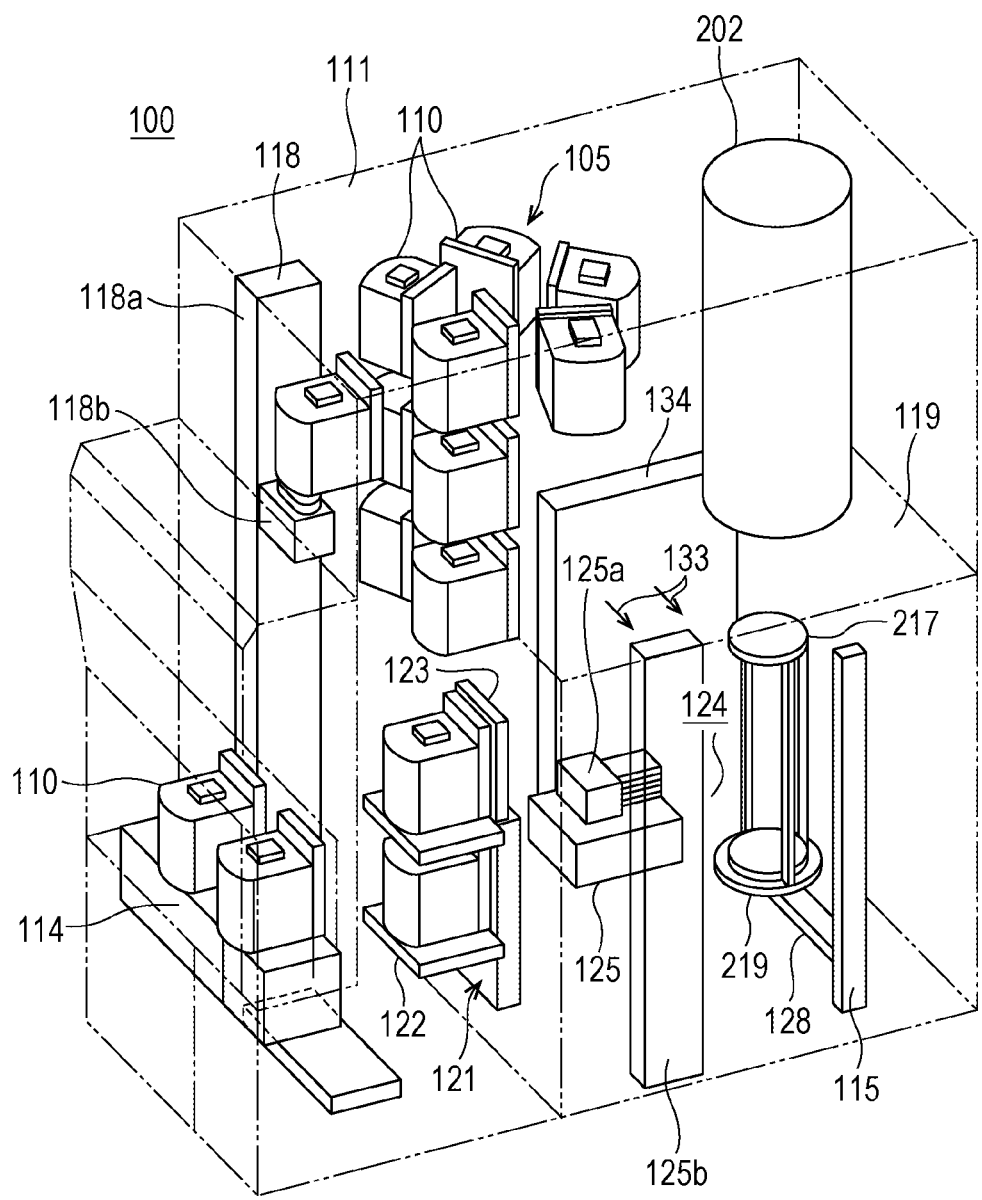
FIG. 1 is a perspective view of a substrate processing apparatus for suitable use in an embodiment of the present invention.
Figure 2:
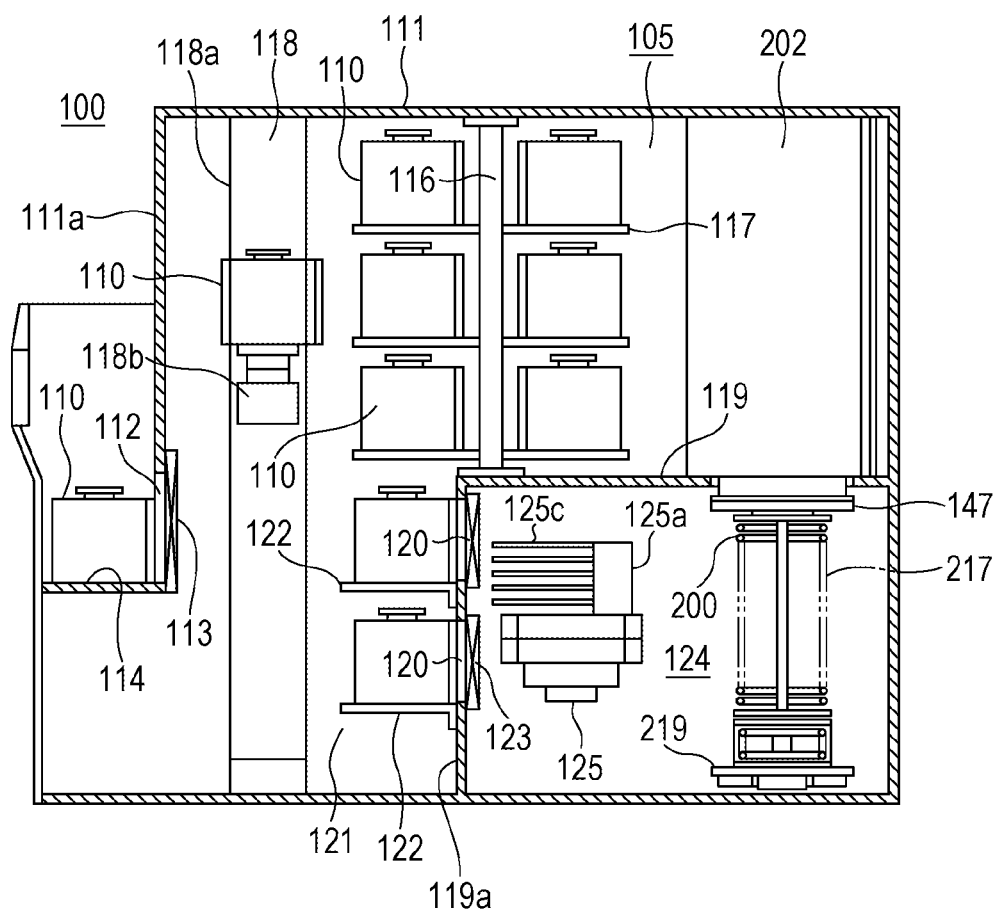
FIG. 2 is a vertical sectional view of the substrate processing apparatus for suitable use in an embodiment of the present invention.

A substrate processing apparatus in an embodiment of the present invention will be described below with reference to the accompanying drawings. An exemplary substrate processing apparatus in this embodiment is implemented by a semiconductor manufacturing apparatus that performs processes in accordance with a method of manufacturing semiconductor devices (integrated circuits (IC)). The following description will be given regarding a case where the substrate processing apparatus is applied to a batch type vertical semiconductor manufacturing apparatus (referred to below as simply a processing apparatus) that subjects substrates to oxidization and diffusion treatments and CVD (chemical vapor deposition). FIG. 1 is a perspective view of the processing apparatus that employs the present invention, and shows it in an oblique view. FIG. 2 is a perspective view of a side of the substrate processing apparatus illustrated in FIG. 1.

As illustrated in FIG. 2, a processing apparatus 100 in this embodiment uses pods 110 as wafer carriers that accommodate wafers (substrates) 200, for example, made of silicon, and is provided with a housing 111. The housing 111 has a front wall 111a provided with a pod carry-in/carry-out opening 112 through which the interior of the housing 111 communicates with the outside thereof; this pod carry-in/carry-out opening 112 is opened and closed by a front shutter 113. A load port 114 is installed in front of the pod carry-in/carry-out opening 112; a pod 110 is placed on this load port 114. Each pod 110 is carried to the load port 114 or carried from the load port 114 by an in-process transfer device (not illustrated).

A rotation rack 105 is installed in the upper space within the housing 111 at substantially the center in a front to back direction. This rotation rack 105 is rotatable around a pole 116 and stores a plurality of pods 110 on shelves 117. As illustrated in FIG. 2, a pod carrying device 118 is installed in the housing 111 between the load port 114 and the rotation rack 105. This pod carrying device 118 includes a pod elevator 118a and a pod carrying mechanism 118b; the pod elevator 118a is movable vertically while holding a pod 110, and the pod carrying mechanism 118b functions as a lateral carrying mechanism. The pod carrying device 118 carries a pod 110 between the rotation rack 105 and pod openers 121 and between the load port 114 and the pod openers 121.

As illustrated in FIG. 2, a sub-housing 119 is structured in the housing 111 so as to extend from substantially the center to the back end in the front to back direction. A pair of wafer carry-in/carry-out openings 120 through which each wafer 200 is carried into the sub-housing 119 or carried out of it is provided in the front wall 119a of the sub-housing 119 side by side in a vertical direction. The pair of pod openers 121 and 121 is installed in the respective wafer carry-in/carry-out openings 120 and 120 arranged vertically. The pod openers 121 include: mounts 122 and 122 on which pods 110 are placed; and cap attaching/detaching mechanisms 123 and 123 that attach/detach caps (lid bodies) to or from the pods 110. The cap attaching/detaching mechanism 123 attaches the caps to the pods 110 placed on the mounts 122 or detaches the caps therefrom whereby the pod openers 121 open or close the wafer input/output openings of the pods 110. Each mount 122 is a transfer shelf on which a substrate container is placed when a substrate is transferred.

As illustrated in FIG. 2, the sub-housing 119 configures a transfer chamber 124 isolated from the atmosphere in the space within which the pod carrying device 118 and the rotation rack 105 are installed. A wafer transfer mechanism 125 is installed in a front region within the transfer chamber 124 and transfers substrates stored in the pods 110 to a boat 217 that serves as a substrate holding tool. This wafer transfer mechanism 125 configures a substrate transfer machine as a substrate transfer section. This wafer transfer mechanism 125 includes a wafer transfer device 125a and a wafer transfer device elevator 125b; the wafer transfer device 125a places the wafers 200 on tweezers 125c and can linearly move or rotate them in a horizontal direction, and the wafer transfer device elevator 125b moves the wafer transfer device 125a vertically. Both the wafer transfer device elevator 125b and the wafer transfer device 125a continuously operate, loading/unloading the wafers 200 onto or from the boat 217.

As illustrated in FIG. 1, a clean unit 134 is installed in the transfer chamber 124. This clean unit 134 includes a supply fan and a dustproof filter in order to supply a clean air 133 that is a clean inert gas. The clean unit 134 configures an inert gas supply section that supplies an inert gas to the transfer chamber 124. The transfer chamber 124 is provided with a transfer chamber exhaust section (not illustrated) that exhausts the atmosphere in the transfer chamber 124 to the outside. The transfer chamber exhaust section returns part of the atmosphere to be exhausted to the outside of the transfer chamber 124 to the clean unit 134, thereby circulating it. In turn, it exhausts the remaining part of the atmosphere to the outside of the substrate processing apparatus 100. As illustrated in FIG. 2, a process furnace 202 is provided above the boat 217. This process furnace 202 includes a substrate processing chamber (not illustrated) therein, and a heater (not illustrated) around this substrate processing chamber to heat its interior. The process furnace 202 is opened or closed on its lower side by a furnace opening cap 147.

As illustrated in FIG. 1, a boat elevator 115 is installed in the transfer chamber 124 and moves the boat 217 vertically. This boat elevator 115 configures a substrate holding tool (boat) carrying machine as a substrate holding tool carrying section. An arm 128 is coupled to the boat elevator 115 and has a seal cap 219 placed in a horizontal position. This seal cap 219 supports the boat 217 vertically and can hermetically close the lower side of the process furnace 202. The boat 217 is provided with a plurality of holding members that hold the plurality of (e.g., 50 to 125) wafers 200 in a horizontal position with their centers aligned with one another vertically.

The substrate processing apparatus 100 in this embodiment has a controller (not illustrated) as a control instrument. The controller includes a CPU and a memory and is connected to an operation unit, an I/O unit, and a storage unit such as a HDD. The controller controls the whole of the substrate processing apparatus 100 by controlling, for example, the rate of gas flowing to the process furnace 202 in the substrate processing apparatus 100, the inner pressure of the process furnace 202, the temperature of the heater in the process furnace 202, and the driving of the boat elevator 115, the wafer transfer mechanism 125 and the like.

Next, a description will be given of an operation of the substrate processing apparatus 100 in this embodiment. This operation is controlled by the controller. As illustrated in FIGS. 1 and 2, when a pod 110 is supplied to the load port 114, the pod carry-in/carry-out opening 112 is opened by the front shutter 113, and then the pod 110 is carried through the pod carry-in/carry-out opening 112. This pod 110 is carried automatically to a designated shelf 117 in the rotation rack 105 by the pod carrying device 118 and stored thereon.

After temporarily being stored in the rotation rack 105, the pod 110 is carried from the shelf 117 to one of the pod openers 121 and placed on the mount 122. Alternatively, the pod 110 is carried directly from the load port 114 to a pod opener 121 and placed on the mount 122. In this case, the wafer carry-in/carry-out opening 120 of the pod opener 121 is closed by the cap attaching/detaching mechanism 123. Accordingly, the clean air 133 as an inert gas flows in the transfer chamber 124, and the transfer chamber 124 is kept at an approximately atmospheric pressure.

As illustrated in FIG. 2, the cap attaching/detaching mechanism 123 detaches the cap from the pod 110 placed on the mount 122 so that the wafer input/output opening in the pod 110 is opened. The wafer transfer device 125a picks up a wafer 200 from the pod 110, and transfers it to the boat 217 so that this wafer 200 is loaded thereon. After delivering the wafer 200 to the boat 217, the wafer transfer device 125a returns to the pod 110 and loads a next wafer 110 onto the boat 217.

While the wafer transfer device 125a is loading a wafer 200 onto the boat 217 through one (an upper or lower one) of the pod openers 121, the pod carrying device 118 is carrying another pod 110 from the rotation rack 105 or the load port 114 to the other one (a lower or upper one) of the pod openers 121. In this way, both pod openers 121 open respective pods 110 simultaneously.

After a preset number of wafers 200 have been loaded onto the boat 217, the lower side of the process furnace 202 is opened by the furnace opening cap 147. Then, the seal cap 219 is moved upward by the boat elevator 115, and then the boat 217 supported by the seal cap 219 is carried into the substrate processing chamber in the process furnace 202.

After the boat loading, the wafers 200 are subjected to an arbitrary process in the substrate processing chamber. Following this process, the boat 217 is carried out of (unloaded from) the substrate processing chamber by the boat elevator 115. After that, the wafers 200 and the pods 110 are discharged from the housing 111 to the outside through substantially the opposite procedures.

First Example

Figure 3:
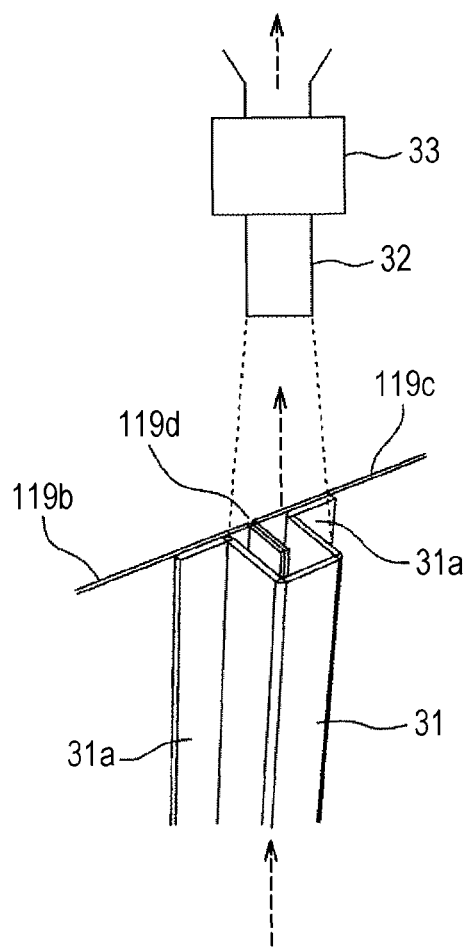
FIG. 3 is an illustrative view of an isolated space creating member for suitable use in a first example of the present invention.

A first example of this embodiment will be described with reference to FIG. 3. FIG. 3 is an illustrative view of an isolated space creating member in the first example. The sub-housing 119 configures the transfer chamber 124, as described above. In this embodiment, the transfer chamber 124 adjoins to the substrate processing chamber (also referred to below as simply a processing chamber). The transfer chamber 124 serves as a transfer chamber in which wafers 200 are transferred between the boat 217 and the pods 110. Also, the transfer chamber 124 serves as a carrying chamber for use in carrying a boat 217 with wafers 200 arranged thereon to or out of the processing chamber. The transfer chamber 124 has an enclosed space filled with an inert gas, such as nitrogen ($N_2$) gas, in order to prevent native oxide films from being formed on wafers 200. Accordingly, the sub-housing 119 is constructed in an airtight structure, and its inner space is kept at an atmospheric pressure or at a pressure that is approximately 50 Pa higher than an atmospheric pressure.

However, it is not easy to adjust the oxygen concentration in the transfer chamber 124 to a target concentration, such as 3 ppm or below. In addition, it is not also easy to make the oxygen concentration reach the target concentration in a short time. The inventor of the present invention and others had conducted studies, and these results reveal that one of causes to inhibit the decrease in the oxygen concentration in the transfer chamber 124 in a short time is that oxygen in external air of the sub-housing 119 is diffused into the transfer chamber 124 through joints of wall bodies constituting the sub-housing 119. This diffusion phenomenon still occurs when the pressure in the transfer chamber 124 has a positive value, or is higher than that the outside of the transfer chamber 124.

As illustrated in FIGS. 1 and 2, wall bodies on the right, left, back (the opposite side of the pod opener 121) and bottom of the sub-housing 119 constitute a part of the housing 111. The sub-housing 119 is formed by joining the front wall 119a, which is the front surface of the sub-housing 119, and a ceiling wall to these right, left, back and bottom walls. In order to form the sub-housing 119, a plurality of plates are joined together with welding or through seal materials, but there is difficulty welding or sealing them completely. In other words, it is not easy to hermetically seal these joints.

In this embodiment, as illustrated in FIG. 3, for example, when a wall body 119b and a wall body 119c in the sub-housing 119 are joined together, a joint 119d between them is covered with a hat rib 31 having, for example, a hat-shaped cross section. Then, respective flanges 31a of the hat rib 31 are joined to the wall bodies 119b and 119c with welding, for example. Alternatively, the flanges 31a can be joined to the wall bodies 119b and 119c with a method other than welding, such as that using a seal or a combination of welding and sealing. The atmosphere in the isolated space created by the hat rib 31 and the wall bodies 119b and 119c is sucked by a suction section 33 via a duct (vent pipe) 32; the suction section 33 includes a blower (fan) and a vacuum pump. The atmosphere in the isolated space is thereby exhausted to outside the substrate processing apparatus 100.

The suction section 33 is provided either inside or outside the substrate processing apparatus 100. If the suction section 33 is provided inside the substrate processing apparatus 100, the duct 32 is provided inside the substrate processing apparatus 100. If the suction section 33 is provided outside the substrate processing apparatus 100, the duct 32 is provided so as to extend from the interior of the substrate processing apparatus 100 to the outside. The duct 32 configures an exhaust section in the substrate processing apparatus 100. Note that the suction section 33 may be included in the exhaust section within the substrate processing apparatus 100.

The configuration in which the duct 32 is connected to the transfer chamber exhaust section in the transfer chamber 124 may be employed. Although not illustrated in the drawings, a transfer chamber exhaust section is composed of, for example, the transfer chamber suction section that includes: a transfer chamber exhaust duct; a transfer chamber exhaust duct on/off valve provided in the transfer chamber exhaust duct; and a vacuum pump provided downstream of the transfer chamber exhaust duct on/off valve. The duct 32 may be installed downstream of the suction section 33 and connected to the transfer chamber exhaust section; alternatively the suction section 33 may not be provided and the duct 32 may be connected to the transfer chamber exhaust section. Furthermore, a duct on/off valve (not illustrated) may be installed in the duct 32 in order to control the exhaustion of the atmosphere in the isolated space by opening or closing the duct 32. For example, the suction section 33 is not provided and the duct 32 is connected to the transfer chamber exhaust section, the duct 32 is connected between the transfer chamber exhaust duct on/off valve and the transfer chamber suction section. For example, the transfer chamber exhaust on/off valve is not provided, the configuration in which the duct 32 is connected to the upstream of the transfer chamber suction section may be employed. This configuration can avoid a complex structure and a cost increase, because it eliminates the need to install the suction section 33.

In FIG. 3, respective peripheral portions of the wall bodies 119b and 119c are bent toward the interior of the transfer chamber 124 and then joined together, forming the joint 119d. At this joint 119d, the wall bodies 119b and 119c may be joined together with welding or through a seal material. In FIG. 3, the arrows denote the flow of the atmosphere. Moreover, although the hat rib 31 and the duct 32 illustrated in FIG. 3 are apart from each other for the purpose of facilitating an understanding, they are in fact interconnected. The hat rib 31 is the isolated space creating member that isolates the joint 119d from the space in the transfer chamber 124. Note that the hat rib 31 may have any given shape in cross section, such as an arc or half cylindrical shape, as long as it can fulfill the function of the isolated space creating member.

In order to decrease the oxygen concentration in the transfer chamber 124, the atmosphere in the isolated space (the space in which the joint 119d is present) created by the hat rib 31 is preferably sucked and exhausted as described above. However, instead of the above sucking configuration, for example, a configuration in which the atmosphere in the isolated space is purged by an inert gas, for example, an $N_2$ gas blow can be employed. In this case, an end of the hat rib 31 is connected to an external unit of the substrate processing apparatus 100 via a duct, whereas the other end of the hat rib 31 is connected via a duct, for example, to the above inert gas supply section (clean unit 134), an $N_2$ gas supply source, or a blower that blows out $N_2$ gas. Moreover, a configuration in which the atmosphere in the isolated space created by the hat rib 31 is sucked and exhausted and an inert gas is fed thereto can be employed. Another configuration in which a pole formed of the hat rib 31 is provided with a suction hole 41h in a second example that will be described later can also be employed.

The first example described above at least produces the effects (A1) to (A2) that will be described below. (A1) Joints of a sub-housing are each isolated from the space in a transfer chamber by isolated space creating members (hat ribs). Then, the atmosphere in each isolated space is exhausted to outside a substrate processing apparatus. Consequently, it is possible to suppress oxygen from being diffused from the joints of the sub-housing into the transfer chamber. Specifically, the atmosphere which would be diffused from the joints of the sub-housing into a housing is confined within the isolated spaces. Then, it is purged from the isolated spaces in such a way that it is not diffused in the space within the transfer chamber. Therefore, it is possible to suppress external oxygen from being diffused into the housing, shortening the time required for the oxygen concentration in the transfer chamber to reach a target concentration. (A2) A configuration in which the atmosphere in each of the above isolated spaces is sucked and exhausted to outside the substrate processing apparatus is more effective in suppressing oxygen from being diffused from the joints of the sub-housing into the space within the transfer chamber. Specifically, by sucking the atmosphere in each isolated space, its inner pressure is reduced to lower than an atmospheric pressure. The transfer chamber is kept at an atmospheric pressure or a pressure that is approximately 50 Pa higher than an atmospheric pressure. This means that the pressure in each isolated space is lower than that in the transfer chamber. Therefore, oxygen in each isolated space is suppressed from being diffused into the transfer chamber.

Second Example

Figure 4:
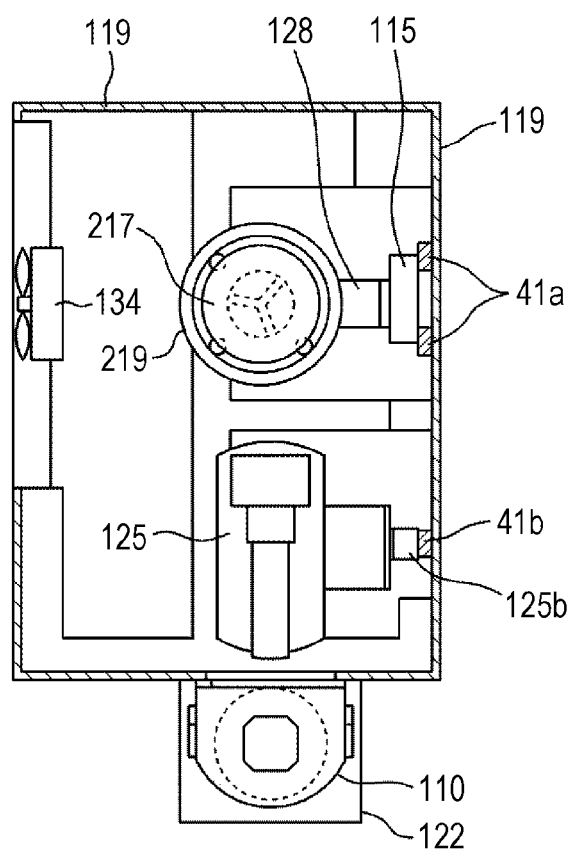
FIG. 4 is a partial top view of a substrate processing apparatus for suitable use in a second example of the present invention.
Figure 5:
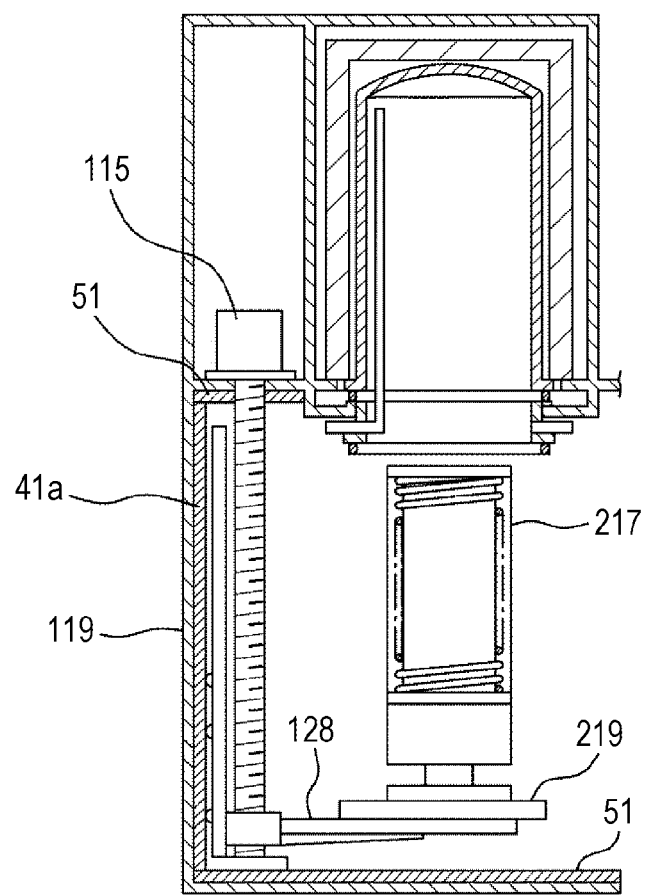
FIG. 5 is a partial vertical sectional view of the substrate processing apparatus for suitable use in the second example of the present invention.
Figure 6:
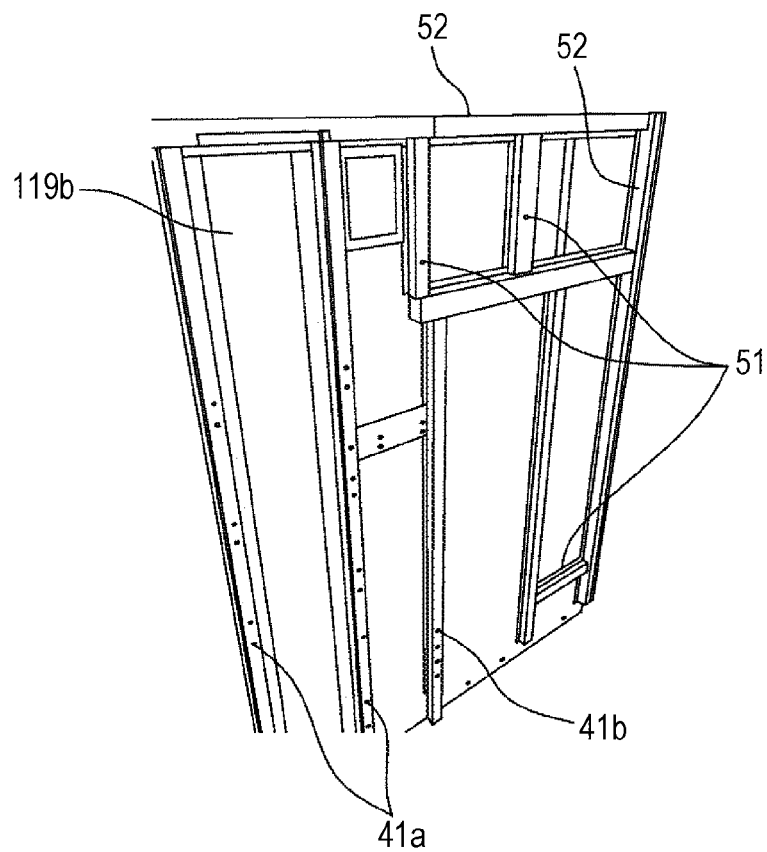
FIG. 6 is an illustrative view of a housing for suitable use in the second example of the present invention.
Figure 7:
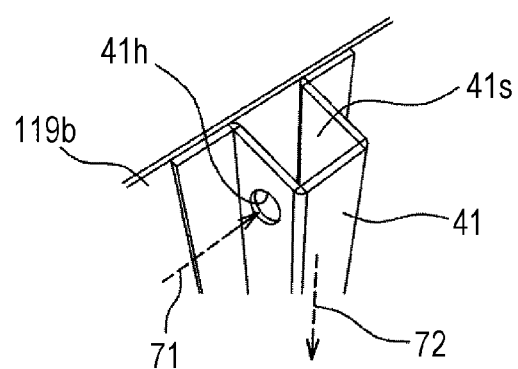
FIG. 7 is an illustrative view of an attachment pillar for suitable use in the second example of the present invention.
Figure 8:
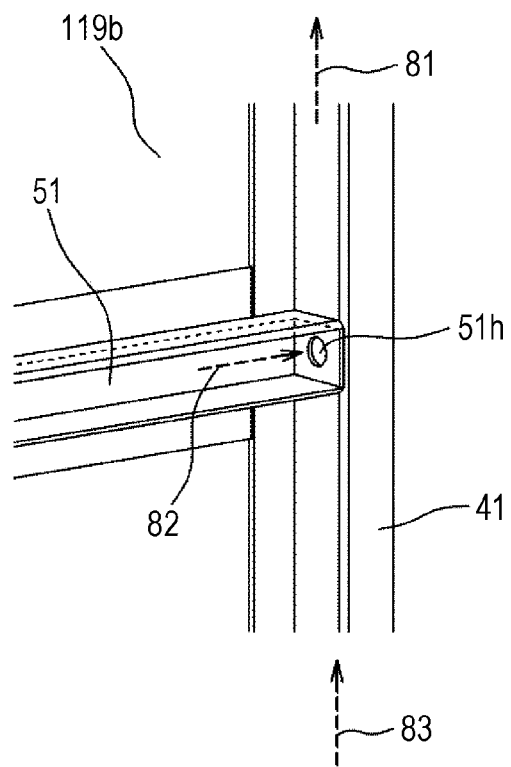
FIG. 8 is an illustrative view of the attachment pillar and a housing reinforcement pillar for suitable use in the second example of the present invention.

A description will be given of a configuration of a second example in this embodiment with reference to FIGS. 4 to 8. FIG. 4 is a partial top view of a substrate processing apparatus in the second example; FIG. 5 is a partial vertical sectional view of the substrate processing apparatus in the second example. FIG. 6 is an illustrative view of a housing in the second example. FIG. 7 is an illustrative view of an attachment pillar in the second example. FIG. 8 is an illustrative view of an attachment pillar and a housing reinforcement pillar in the second example.

The inventor of the present invention and others conducted studies, and concluded from these results that the atmosphere stagnates in the sub-housing 119 and this stagnation inhibits the oxygen concentration in the transfer chamber 124 from reaching a target concentration in a short time. Accordingly, they had attempted to eliminate the stagnation of the atmosphere in the sub-housing 119 by supplying an inert gas to stagnation points or purging air therefrom. However, there were no significant signs of improving the time required for the oxygen concentration to reach a target concentration. The inventor and others further investigated the cause of generating the stagnation. On the basis of the result of the investigation, they determined the major cause. This is caused by the diffusion of atmosphere remaining in spaces in pillars that constitute the sub-housing 119, such as reinforcement pillars used to reinforce the sub-housing 119 and attachment pillars used to attach devices to a housing. Once a transfer chamber is opened, for example, upon assembly or maintenance of devices, it is exposed to external air, and air enters into a plurality of pillars constituting the sub-housing 119. The atmosphere in the pillars cannot be removed sufficiently even by purging air in the sub-housing 119 with an inert gas. For this reason, the atmosphere in the sub-housing 119 is likely to stagnate in the vicinity of pillars constituting the sub-housing 119, or more specifically in the vicinity of seams between pillars and wall bodies. They had concluded that this stagnation is one of the causes of inhibiting the oxygen concentration in the transfer chamber 124 from decreasing in a short time.

As described above, the boat elevator 115 and the wafer transfer mechanism 125 are installed in the transfer chamber 124, and accordingly a lot of atmosphere stagnation points are present therein. In consideration of their strength, a bent-plate-like or I-shaped structure is suitable for pillars, such as boat elevator attachment pillars 41a and transfer elevator attachment pillars 41b. However, an atmosphere is likely to stagnate in the vicinity of the pillars having such a structure. Therefore, oxygen is output from these stagnation points little by little, making it difficult to decrease the oxygen concentration in the transfer chamber 124 in a short time. On the other hand, if pillars, such as the boat elevator attachment pillars 41a and the transfer elevator attachment pillars 41b, are each formed into a hollow pillar structure such as a hat rib structure, atmosphere remaining in the spaces within the pillars is diffused into the transfer chamber 124 little by little through the seams between the pillars and the wall bodies to which the pillars are attached. This makes it difficult to decrease the oxygen concentration in the transfer chamber 124 in a short time.

As illustrated in FIGS. 4 and 5, the boat elevator 115 is attached to the boat elevator attachment pillars 41a, and the boat elevator attachment pillars 41a are attached to a wall surface of the sub-housing 119. The wafer transfer device elevator 125b is attached to the transfer elevator attachment pillar 41b, and the transfer elevator attachment pillar 41b is attached to the wall body of the sub-housing 119. As illustrated in FIG. 5, the boat elevator attachment pillars 41a are attached to housing reinforcement pillars 51 that reinforce the housing 111. As illustrated in FIG. 6, for example, the wall body 119b of the sub-housing 119 is attached to housing struts 52 that support the housing 111. The housing struts 52 are attached to the housing reinforcement pillars 51, the boat elevator attachment pillars 41a and the transfer elevator attachment pillar 41b.

This example aims to decrease the number of atmosphere stagnation points in the transfer chamber 124 and the amount of the residual atmosphere therein. In this example, as illustrated in FIG. 7, pillars constituting the sub-housing 119, such as the housing struts 52, the housing reinforcement pillars 51, the boat elevator attachment pillars 41a and the transfer elevator attachment pillar 41b, each employ a hollow structure, such as a hat rib structure. FIG. 7 illustrates an example in which the attachment pillar 41, such as the boat elevator attachment pillar 41a or the transfer elevator attachment pillar 41b, has a hat rib structure.

If pillars constituting the sub-housing 119, such as a reinforcement pillar used to reinforce the sub-housing 119 and attachment pillars used to attach devices to a housing, are each formed into a hollow structure, stagnation is likely to be generated along the seams between the pillars and wall bodies to which the pillars are attached. Then, residual atmosphere within the space created in each pillar is diffused, causing the stagnation around each pillar. If each pillar has a hat rib structure, the atmosphere that has been isolated by the hat rib structure is diffused into the sub-housing 119, causing the stagnation. In light of the above, as illustrated in FIG. 7, a suction hole 41h is formed in aside wall of the pillar having a hat rib structure. Further, the atmosphere in the transfer chamber 124 is sucked into a hollow part 41s in a pillar having a hollow structure through the suction hole 41h (see an arrow 71 in FIG. 7). Then, it is exhausted to outside the substrate processing apparatus 100 with, for example, the duct 32 and the suction section 33 illustrated in FIG. 3 (see an arrow 72 in FIG. 7). In this case, one or more suction holes 41h are formed to eliminate atmosphere stagnation points. Appropriate shapes of the suction holes 41h, such as a circular, rectangular or slit shape, are preferably selected depending on the locations at which they are formed.

By purging the stagnation of the atmosphere in the vicinity of each pillar in the above manner, the oxygen concentration in the transfer chamber 124 can be decreased in a short time. Furthermore, sucking air in the hollow part 41s decreases its inner pressure to lower than an atmospheric pressure. More specifically, since the transfer chamber is kept at an atmospheric pressure or at a pressure that is approximately 50 Pa higher than an atmospheric pressure, the pressure in the hollow part 41s is kept lower than that in the transfer chamber. This generates an air flow that propagates an inert gas from the transfer chamber to the hollow part 41s through the suction hole 41h, preventing the atmosphere in the hollow part 41s from being diffused into the transfer chamber.

Alternatively, a configuration in which the suction hole 41h is not formed in aside wall may be employed. In this case, the pressure in the hollow part 41s is kept lower than that in the transfer chamber, and the atmosphere in the isolated space is exhausted. As a result, the atmosphere in the space isolated by the hat rib structure is exhausted in such a way that it is not diffused into the space in the transfer chamber. In this way, oxygen in the hat rib structure is prevented from being diffused into the sub-housing 119. Furthermore, the atmosphere around the hat rib structure is sucked into the hat rib structure through the seam between a wall body of the sub-housing 119 and a pillar with the hat rib structure. This makes it possible to shorten the time until the oxygen concentration in the transfer chamber reaches a target concentration. This exhaustion is configured such that the atmosphere in the isolated space is sucked and exhausted to outside the substrate processing apparatus. Simultaneously with this, an inert gas may be supplied to the isolated space. This makes it possible to suppress more effectively oxygen in an isolated space within a hat rib from being diffused into the sub-housing 119.

In this example, as illustrated in FIG. 8, a preferred configuration is that a plurality of pillars constituting the sub-housing 119, including attachment pillars 41 such as the housing reinforcement pillars 51 and the boat elevator attachment pillars 41a, each have a hollow structure, and these pillars are coupled and joined together so as to communicate with one another through a communication hole 51h. Here, welding or sealing can be used as this joining method. Moreover, atmosphere 82 in the housing reinforcement pillar 51 is exhausted to inside an attachment pillar 41 through the communication hole 51h (see an arrow 82 in FIG. 8), and then atmosphere 81 in the attachment pillar 41 is exhausted to outside the substrate processing apparatus 100 (see an arrow 81 in FIG. 8). In this case, suction holes 41h as illustrated in FIG. 7 are formed in the housing reinforcement pillar 51 at appropriate sites so that atmosphere stagnation points are eliminated. The end of the attachment pillar 41 in the flow direction of the atmosphere 81 is connected to the duct 32 and the suction section 33 illustrated in FIG. 3.

Alternatively, a structure in which the suction hole 41h is not formed in the side wall may be employed. In this case, the pressure in the hollow part 41s is kept lower than that in the transfer chamber, and air in the isolated space is exhausted. As a result, the atmosphere in the space isolated by the hat rib structure is exhausted in such a way that it is not diffused into the space in the transfer chamber. In this way, oxygen in the hat rib structure is prevented from being diffused into the sub-housing 119. This makes it possible to shorten the time until the oxygen concentration in the transfer chamber reaches a target concentration. This exhaustion is configured such that the atmosphere in the isolated space is sucked and exhausted to outside the substrate processing apparatus. Simultaneously with this, an inert gas may be supplied to the isolated space.

As illustrated in FIG. 6, a plurality of pillars constituting the sub-housing 119 may all be coupled to one another, and the suction section 33 may be provided in one of these pillars and exhaust atmosphere in the pillars to outside the substrate processing apparatus 100. This structure is preferred in terms of reducing the cost of a suction section. Instead of the configuration in which a plurality of pillars constituting the sub-housing 119 are joined so as to form a single piece, a configuration may be employed in which the pillars are joined so as to form a plurality of pieces and a suction section 33 is provided for each piece. A more preferable configuration is that a plurality of pillars constituting the sub-housing 119 are coupled so as to be formed into a tree structure, and the suction section 33 is provided at the top of this tree structure. This configuration can prevent stagnation of atmosphere in the pillars, because it creates no closed loops in the pillars.

Preferably, the atmosphere is purged in all the pillars constituting the sub-housing 119. However, a configuration may also be employed in which of the pillars constituting the sub-housing 119, one or more in which an atmosphere is more likely to stagnate are selected and the atmosphere in the selected pillars is exhausted. This configuration can still produce effects of this example. Furthermore, the atmosphere in the pillars does not necessarily have to be continuously exhausted; it may be exhausted at regular intervals. For example, a configuration in which the atmosphere in the pillars is exhausted after a transfer chamber is exposed to external air upon maintenance can still produce effects of this example.

Figure 9:
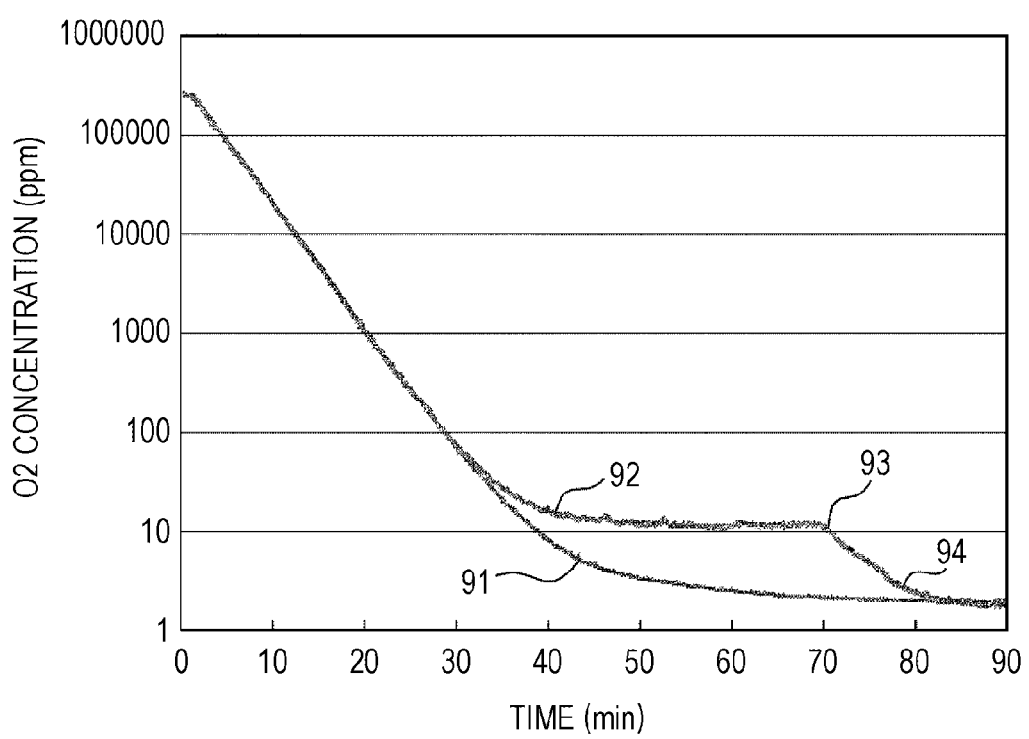
FIG. 9 is a view for use in demonstrating effects of the second example of the present invention.

FIG. 9 is a view for use in demonstrating effects of the second example. The vertical axis represents an oxygen concentration; the horizontal axis represents time. In FIG. 9, the reference numeral 91 denotes the temporal transition of the oxygen concentration in the transfer chamber 124 in the second example. The reference numeral 92 denotes the temporal transition of the oxygen concentration in the transfer chamber 124 in a conventional structure. The reference numeral 94 denotes the temporal transition of the oxygen concentration when the atmosphere in pillars in the second example starts being exhausted at a point 93 positioned at a midway of the reference numeral 92. FIG. 9 demonstrates that the second example can eliminate the stagnation of the atmosphere in the transfer chamber 124 by the purging atmosphere in pillars constituting the sub-housing 119, thus decreasing the oxygen concentration in the transfer chamber 124 in a short time. In this case, a configuration may be employed in which the pillars are connected to the transfer chamber exhaust section in the transfer chamber 124 and the atmosphere in the pillars is exhausted thereby.

The second example described above at least produces the effects (B1) to (B4) that will be described below. (B1) Pillars constituting a sub-housing each have a hollow structure, and a hollow part in each pillar has a lower pressure than a transfer chamber. This configuration can purge the atmosphere stagnating around the pillars. (B2) Pillars constituting a sub-housing each have a hollow structure, and a suction hole is formed in a side wall of this hollow structure. The atmosphere in a transfer chamber is sucked into a hollow part of each pillar and exhausted to outside a substrate processing apparatus. This configuration can exhaust the atmosphere stagnating around the pillars. (B3) Pillars constituting a sub-housing each have a hollow structure and are coupled and joined together so as to communicate with one another, and a suction hole is formed in a side wall of each pillar. The atmosphere in a transfer chamber is sucked into a hollow part of each pillar and exhausted to outside a substrate processing apparatus. This configuration can be effective in exhausting atmosphere stagnating in the transfer chamber. (B4) Pillars constituting a sub-housing are each formed into a tree structure. This configuration can prevent stagnation of the atmosphere in the pillars.

Third Example

A third example is equivalent to the combination of the first and second examples described above. More specifically, in the third example, the hat ribs 31 in the first example are coupled and joined to the attachment pillars 41, the housing reinforcement pillars 51 and the housing struts 52 in the second example. Each hat rib 31 communicates with each pillar. The atmosphere in the hat ribs 31 and these pillars is exhausted to outside the substrate processing apparatus.

The third example produces the following effect (C1), in addition to the effects of the first and second examples described above. (C1) It is possible to exhaust the atmosphere in hat ribs and pillars to outside a substrate processing apparatus by using a simple exhaustion system.

Obviously, the present invention is not limited to the embodiments described above and can be modified in various ways without departing from its spirit. In the embodiments, the present invention is applied to a transfer chamber (carrying chamber) provided with a wafer transfer machine and a boat carrying machine in which wafers are transferred between a boat and each individual pod. However, application of the present invention is not limited to transfer chambers, and it is also applicable to, for example, substrate standby chambers that require a decreased oxygen concentration. Moreover, if at least one of the wafer transfer machine and the boat carrying machine is installed outside a transfer chamber, the present invention is still applicable to this transfer chamber. In the embodiment, the sub-housing 119, the hat ribs 31, the attachment pillars 41, the housing reinforcement pillars 51 and the housing struts 52 are each made of stainless steel; however they can be made of another material such as aluminum.

The present invention is applicable to not only batch-type vertical or lateral processing apparatuses but also sheet feed apparatuses that process one or more substrates at a time. Furthermore, the present invention is applicable to not only semiconductor manufacturing apparatuses but also glass substrate processing apparatuses, such as LCD manufacturing apparatuses, and other substrate processing apparatuses. The substrate processes may include CVD, PVD, ALD and film forming processes of forming epitaxial growth, oxide, nitride, metal-containing and other films, as well as annealing, oxidation, diffusion, etching, exposure, lithography, application, molding, development, dicing, wire bonding, inspection and other processes.

Preferred aspects of the present invention will be appended below.

(Appendix 1)

An aspect of the present invention provides a substrate processing apparatus that includes: a processing chamber configured to process a substrate; and a carrying chamber used to carry the substrate to the processing chamber. The carrying chamber includes: a plurality of wall bodies configured to form a housing of the carrying chamber; a joint at which the plurality of wall bodies are joined; and an isolated space creating member configured to cover the joint and thereby create an isolated space separated from the carrying chamber. The substrate processing apparatus further includes an exhaust section configured to purge gas in the isolated space.

(Appendix 2)

In the substrate processing apparatus of appendix 1, the carrying chamber preferably includes a hollow-structured housing reinforcement pillar configured to reinforce the housing of the carrying chamber. The housing reinforcement pillar has a hollow part in which gas is purged.

(Appendix 3)

In the substrate processing apparatus of appendix 2, the housing reinforcement pillar is preferably coupled to the isolated space creating member, and the hollow part of the housing reinforcement pillar thereby communicates with the isolated space. The exhaust section is preferably configured to purge gas in the isolated space and the hollow part of the housing reinforcement pillar.
(Appendix 4)

In the substrate processing apparatus described in one of appendices 1 to 3, the carrying chamber preferably includes: a substrate transfer section configured to transfer the substrate to a substrate retainer and mount the substrate thereon; a substrate retainer carrying section configured to carry the substrate retainer holding the substrate into the processing chamber; and a hollow-structured attachment pillar configured to attach the substrate transfer section and the substrate retainer carrying section to the housing of the carrying chamber. The attachment pillar preferably has a hollow part in which gas is purged.
(Appendix 5)

In the substrate processing apparatus of appendix 4, the housing reinforcement pillar is preferably coupled to the isolated space creating member and the hollow part of the attachment pillar, and the hollow part in the housing reinforcement pillar thereby communicates with the isolated space and the hollow part of the attachment pillar. The exhaust section is preferably configured to purge gas in the isolated space, a reinforcement pillar of the housing and the hollow part of the attachment pillar.
(Appendix 6)

In the substrate processing apparatus of appendix 4, the housing reinforcement pillar is preferably coupled to the hollow part of the attachment pillar, and the housing reinforcement pillar thereby communicates with the hollow part of the attachment pillar. The substrate processing apparatus preferably includes: a first exhaust section configured to purge gas in the housing reinforcement pillar and the hollow part of the attachment pillar; and a second exhaust section configured to purge gas in the isolated space.
(Appendix 7)

In the substrate processing apparatus described in one of appendices 4 to 6, a suction hole is preferably formed in at least one of respective side surfaces of the isolated space creating member, the housing reinforcement pillar and the attachment pillar.
(Appendix 8)

In the substrate processing apparatus described in one of appendices 1 to 7, the transfer chamber preferably includes: an inert gas supply section configured to supply an inert gas to the transfer chamber; and a transfer chamber exhaust section configured to purge gas in the transfer chamber. Both the inert gas supply section and the transfer chamber exhaust section are preferably configured to supply the inert gas to the transfer chamber and purge the inert gas therefrom.
(Appendix 9)

In the substrate processing apparatus of appendix 8, the exhaust section is preferably configured to be coupled to the transfer chamber exhaust section.
(Appendix 10)

Another aspect of the present invention provides a substrate processing apparatus that includes: a processing chamber configured to process a substrate; and a standby chamber in which the substrate to be processed in the processing chamber is kept on standby. The standby chamber includes: a plurality of wall bodies configured to form a housing of the standby chamber; a joint at which the plurality of wall bodies are joined; and an isolated space creating member configured to cover the joint and thereby create an isolated space separated from the standby chamber. The substrate processing apparatus further includes an exhaust section configured to purge gas in the isolated space.
(Appendix 11)

Another aspect of the present invention provides a substrate processing apparatus that includes: a processing chamber configured to process a substrate; and a carrying chamber configured to carry the substrate to the processing chamber. The carrying chamber includes: a substrate transfer section configured to transfer the substrate to a substrate retainer and mount the substrate thereon; a substrate retainer carrying section configured to carry the substrate retainer holding the substrate into the processing chamber; and a hollow-structured attachment pillar configured to attach the substrate transfer section and the substrate retainer carrying section to the housing of the carrying chamber. The substrate processing apparatus further includes an exhaust section configured to purge gas in the hollow part of the attachment pillar.
(Appendix 12)

Another aspect of the present invention provides a method of manufacturing a semiconductor device. The method of manufacturing a semiconductor device uses a substrate processing apparatus that includes: a processing chamber configured to process a substrate; and a carrying chamber used to carry the substrate to the processing chamber. The carrying chamber includes: a plurality of wall bodies configured to form a housing of the carrying chamber; a joint at which the plurality of wall bodies are joined; and an isolated space creating member configured to cover the joint and thereby create an isolated space separated from the carrying chamber. The method of manufacturing a semiconductor device includes: carrying a substrate from the carrying chamber into the processing chamber; purging gas in the isolated space; and processing the substrate that has been carried into the processing chamber.
(Appendix 13)

Another aspect of the present invention provides a method of manufacturing a semiconductor device which includes: preparing a carrying chamber used to carry a substrate to a processing chamber, the carrying chamber including a plurality of wall bodies configured to form a housing of the carrying chamber, a joint at which the plurality of wall bodies are joined, and an isolated space creating member configured to cover the joint and thereby create an isolated space separated from the carrying chamber; carrying the substrate from the carrying chamber into the processing chamber; purging gas in the isolated space; and processing the substrate that has been carried into the processing chamber.
(Appendix 14)

Another aspect of the present invention provides a method of processing a substrate. The method of processing a substrate uses a substrate processing apparatus that includes: a processing chamber configured to process a substrate; and a carrying chamber used to carry the substrate to the processing chamber. The carrying chamber includes: a plurality of wall bodies configured to form a housing of the carrying chamber; a joint at which the plurality of wall bodies are joined; and an isolated space creating member configured to cover the joint and thereby create an isolated space separated from the carrying chamber. The method of processing a substrate includes: carrying a substrate from the carrying chamber into the processing chamber; purging gas in the isolated space; and processing the substrate that has been carried into the processing chamber.

(Appendix 15)

Another aspect of the present invention provides a method of processing a substrate which includes: preparing a carrying chamber used to carry a substrate to a processing chamber, the carrying chamber including a plurality of wall bodies configured to form a housing of the carrying chamber, a joint at which the plurality of wall bodies are joined, and an isolated space creating member configured to cover the joint and thereby create an isolated space separated from the carrying chamber; carrying the substrate from the carrying chamber into the processing chamber; purging gas in the isolated space; and processing the substrate that has been carried into the processing chamber.

(Appendix 16)

A still another aspect of the present invention provides a method of manufacturing a semiconductor device which includes: purging gas in an isolated space forming section in a carrying chamber, the carrying chamber configured to carry a substrate to a processing chamber in which the substrate is to be processed, the carrying chamber including a joint at which a plurality of wall bodies are joined, and the isolated space creating section configured to cover the joint and thereby form an isolated space separated from the carrying chamber; carrying the substrate into the processing chamber; and processing the substrate.

(Appendix 17)

Another aspect of the present invention provides a method of processing a substrate which includes: purging gas in an isolated space forming section in a carrying chamber, the carrying chamber configured to carry a substrate to a processing chamber in which the substrate is to be processed, the carrying chamber including a joint at which a plurality of wall bodies are joined, and the isolated space creating member configured to cover the joint and thereby form an isolated space separated from the carrying chamber; transferring the substrate to a substrate retainer and mounting the substrate thereon in the carrying chamber; carrying the substrate into the processing chamber; and processing the substrate.

This application is based upon and claims the benefit of priority of the Japanese Patent Application No. 2012-214231 filed on Sep. 27, 2012, the entire contents of which are incorporated herein by reference.

INDUSTRIAL APPLICABILITY

It is possible to shorten the time needed to decrease the oxygen concentration in a housing to a desired concentration.

REFERENCE SIGNS LIST 31 isolated space creating member (hat rib)
31a flange
32 vent pipe (duct)
33 suction section
41 attachment pillar
41a boat elevator attachment pillar
41b transfer elevator attachment pillar
41h suction hole
41s isolated space
51 housing reinforcement pillar
51h communication hole
52 housing strut
100 substrate processing apparatus
105 rotation rack
110 pod
111 housing
111a front wall
112 pod carry-in/carry-out opening
113 front shutter
114 load port
115 boat elevator (substrate retainer carrying machine)
116 pole
117 shelf
118 pod carrying device
118a pod elevator
118b pod carrying mechanism
119 sub-housing
119a front wall
119b wall body
119c wall body
119d joint
120 wafer carry-in/carry-out opening
121 pod opener
122 mount
123 cap attaching/detaching mechanism
124 transfer chamber (carrying chamber)
125 wafer transfer mechanism (substrate transfer machine)
125a wafer transfer device
125b wafer transfer device elevator
128 arm
133 clean air
134 clean unit
142 wafer carry-in/carry-out aperture
147 furnace opening cap
200 wafer (substrate)
202 process furnace
217 boat (substrate retainer)
219 seal cap

The invention claimed is:

1. A substrate processing apparatus comprising:
a processing chamber configured to process a substrate; and
a carrying chamber configured to carry the substrate to the processing chamber,
the carrying chamber including:
a plurality of wall bodies configured to form a housing of the carrying chamber;
a joint at which the plurality of wall bodies are joined; and
an isolated space creating member comprising a hat-shaped cross section and configured to cover the joint and provide an isolated space between the plurality of wall bodies, the joint and the isolated space creating member and separated from an inner space of the carrying chamber; and
an exhaust section configured to exhaust atmosphere in the isolated space formed by the plurality of wall bodies, the joint and the isolated space creating member.

2. A method of processing a substrate, the method using a substrate processing apparatus, the substrate processing apparatus including a processing chamber configured to process a substrate, and a carrying chamber configured to carry the substrate to the processing chamber, the carrying chamber including a plurality of wall bodies configured to form a housing of the carrying chamber, a joint at which the plurality of wall bodies are joined, and an isolated space creating member comprising a hat-shaped cross section and configured to cover the joint and provide an isolated space between the plurality of wall bodies, the joint and the isolated space creating member and separated from an inner space of the carrying chamber, and an exhaust section configured to purge gas in the isolated space formed by the plurality of wall bodies, the joint and the isolated space creating member, the method comprising:

carrying a substrate from the carrying chamber into the processing chamber;

exhausting atmosphere in the isolated space; and processing the substrate that has been carried into the processing chamber.

3. A method of manufacturing a semiconductor device, the method using a substrate processing apparatus, the substrate processing apparatus including: a processing chamber configured to process a substrate; and a carrying chamber configured to carry the substrate to the processing chamber, the carrying chamber including: a plurality of wall bodies configured to form a housing of the carrying chamber; a joint at which the plurality of wall bodies are joined; and an isolated space creating member comprising a hat-shaped cross section and configured to cover the joint and provide an isolated space between the plurality of wall bodies, the joint and the isolated space creating member and separated from an inner space of the carrying chamber, and an exhaust section configured to purge gas in the isolated space formed by the plurality of wall bodies, the joint and the isolated space creating member the method including:

carrying a substrate from the carrying chamber into the processing chamber;

exhausting atmosphere in the isolated space; and processing the substrate that has been carried into the processing chamber.

4. The apparatus according to claim 1, wherein the isolated space creating member includes a flange jointed to the wall bodies.

5. The apparatus according to claim 4, wherein an end of the isolated space creating member is connected to an inert gas supply section via a duct providing a first throughway between the inert gas supply section and an external portion of the apparatus for receiving an inert gas supplied into the isolated space.

6. The apparatus according to claim 5, further including:
a hollow housing reinforcement pillar configured to reinforce the housing.

7. The apparatus according to claim 6, wherein the housing reinforcement pillar and the isolated space creating member are coupled to each other.

8. The apparatus according to claim 7, wherein a hole is formed in a side wall of the housing reinforcement pillar.

9. The apparatus according to claim 8, wherein the exhaust section is connected to a carrying chamber exhaust section providing a second throughway to exhaust the atmosphere in the carrying chamber.

10. The apparatus according to claim 9, wherein a pressure of the isolated space is lower than atmospheric pressure and a pressure of the carrying chamber is equal to or higher than atmospheric pressure.

* * * * *